(12) United States Patent
Goyal et al.

(10) Patent No.: US 12,242,780 B2
(45) Date of Patent: Mar. 4, 2025

(54) AGENT ASSISTED MODEL DEVELOPMENT

(71) Applicant: INTERNATIONAL BUSINESS MACHINES CORPORATION, Armonk, NY (US)

(72) Inventors: Praduemn K. Goyal, Holmdel, NJ (US); Richard Earl Harken, Oxford, MI (US); Gandhi Sivakumar, Bentleigh (AU); Abhishek Jain, Baraut (IN)

(73) Assignee: International Business Machines Corporation, Armonk, NY (US)

( * ) Notice: Subject to any disclaimer, the term of this patent is extended or adjusted under 35 U.S.C. 154(b) by 613 days.

(21) Appl. No.: 17/514,063

(22) Filed: Oct. 29, 2021

(65) Prior Publication Data

US 2023/0136564 A1    May 4, 2023

(51) Int. Cl.
*G06F 30/27*    (2020.01)
*G06N 5/02*    (2023.01)

(52) U.S. Cl.
CPC ............... *G06F 30/27* (2020.01); *G06N 5/02* (2013.01)

(58) Field of Classification Search
CPC ................................. G06F 30/27; G06N 5/02
See application file for complete search history.

(56) References Cited

U.S. PATENT DOCUMENTS

| | | | |
|---|---|---|---|
| 10,291,733 | B2 | 5/2019 | Goldstein et al. |
| 11,003,486 | B2 | 5/2021 | Bailey et al. |
| 2020/0167258 | A1* | 5/2020 | Chattopadhyay ..... G06F 9/5088 |
| 2020/0410399 | A1* | 12/2020 | Lang ......................... G06N 5/01 |
| 2021/0034581 | A1 | 2/2021 | Boven et al. |

OTHER PUBLICATIONS

Kachaoui, Jabrane, and Abdessamad Belangour. "Improving a New Data Lake Architecture Design Based on Data Ponds and Multi-Agent Paradigms." The Proceedings of the International Conference on Smart City Applications. Cham: Springer International Publishing, 2021. (Year: 2021).*
Case Study, Intel® Xeon® Processor E5 Series, Traffic Management, Big Data Analytics, Improving traffic management with big data analytics, 2013, 2 pages.

(Continued)

*Primary Examiner* — Kevin W Figueroa
(74) *Attorney, Agent, or Firm* — Schmeiser, Olsen & Watts, LLP; Aaron Pontikos

(57) ABSTRACT

A method, computer program product, and computer system for using agents at a data lake to assist training, testing, and deploying a model for predicting one or more outputs from specified input to the model, using agents at the data lake. The agents identify at the data lake: hardware resources, a first portion of model input data for training and testing the model, a training language, and a first software resource. A first execution of the first software resource is triggered to split the first portion of the model input data into training input data and testing input data. A first portion of the hardware resources is identified for training and testing the model. A second software resource stored at the data lake is identified for optimizing the model in accordance with an optimization algorithm. Training the model at the data lake is triggered.

20 Claims, 16 Drawing Sheets

(56) References Cited

OTHER PUBLICATIONS

E-Science platform for cross-institutional, interdisciplinary, collaborative research in emerging sciences and technologies, IP.com No. IPCOM000134640D, Original Publication Date: Mar. 13, 2006, 6 pages.

Article, Method and System for Monitoring and Dynamically Managing Business, Scientific and Environmental Exceptions for Laboratory Information Management Systems, Authors et al.: Disclosed Anonymously, IP.com No. IPCOM000199709D, IP.com Electronic Publication Date: Sep. 15, 2010, 7 pages.

A Computing Model for Real-Time Traffic Data Processing, Authors et. al.: Disclosed Anonymously IP.com No. IPCOM000211243D, IP.com Electronic Publication Date: Sep. 29, 2011, 13 pages.

Edoardo Patti et al., IoT platform for Smart Cities: requirements and implementation case studies, Original Citation: Patti, Edoardo; Acquaviva, Andrea (2016). IoT platform for Smart Cities: requirements and implementation case studies. In: 2nd IEEE International Forum on Research and Technologies for Society and Industry Leveraging a better tomorrow (RTSI 2016), Bologna, Italy, Sep. 7-9, 2016. pp. 1-6, 7 pages.

Dr. Akey Sungheetha, et al., Real Time Monitoring and Fire Detection using Internet of Things and Cloud based Drones, Journal of Soft Computing Paradigm (JSCP) (2020), vol. 02/ No. 03, pp. 168-174, http://irojournals.com/scp/, DOI: https://doi.org/10.36548/jscp.2020.3.004, 8 pages.

Mell, Peter et al.; "The NIST Definition of Cloud Computing;" National Institute of Standards and Technology; Special Publication 800-145; Sep. 2011; 7 pages.

* cited by examiner

AGENT ASSISTED MODEL DEVELOPMENT

BACKGROUND

The present invention relates in general to model development and in particular to agent support for model development.

In any industry, there is a need for technology offering a best or improved approach to controlling data and driving insights for using data efficiently and effectively.

SUMMARY

Embodiments of the present invention provide a method, a computer program product and a computer system, for predicting one or more outputs from specified input to the model. The model having originated at a data science platform communicatively coupled to a data lake.

Provided, at the data lake using one or more processors of a computer system at the data lake, is a hierarchy of agents with a managing agent at a root node at level 0 of the hierarchy and multiple first level agents at respective nodes at a first level of the hierarchy. Each first level agent is a child agent of the managing agent. The first level agents include a hardware resources agent, a software resources agent, a data resources agent, a software control agent, and a programming languages agent.

Identified, by the hardware resources agent using the one or more processors, is two or more hardware resources stored at the data lake and physical characteristics of each hardware resource. Each hardware resource is usable for training and testing the model.

Identified, by the data resources agent using the one or more processors, is model input data stored at the data lake and an access speed for accessing the model input data and portions of the input data distributed in different storage locations in the data lake. The model input data includes data usable as the specified input to the model.

Identified, by the data resources agent using the one or more processors, is a first portion of the model input data to be used for said training and testing the model. The identifying of the first portion of the model input data is based on a specified target accuracy of the model.

Identified, by the software resources agent using the one or more processors, is a first software resource stored at the data lake. The first software resource is program code configured to split the first portion of the model input data into training input data for training the model and testing input data for testing the model.

Triggered, by the software control agent using the one or more processors, is a first execution at the data lake of the first software resource to split the first portion of the model input data into the training input data and the testing input data.

Identified, by the hardware resources agent using the one or more processors, is a first portion of the hardware resources available to be used for training and testing the mode. The identifying of the first portion of the hardware resources is based on a size of the first portion of model input data, the access speed for accessing the first portion of the model input data, and the physical characteristics of the hardware resources.

Identifying, by the programming languages agent using the one or more processors, a data model training language available at the data lake.

identified, by the software resources agent using the one or more processors, is a second software resource stored at the data lake. The second software resource is program code configured to be used for optimizing the model in accordance with an optimization algorithm used during said training the model.

Triggered, by the software control agent using the one or more processors, is the training of the model at the data lake using the training input data, the first portion of the hardware resources, the data model training language, and the second software resource.

DETAILED DESCRIPTION

Figure 1:
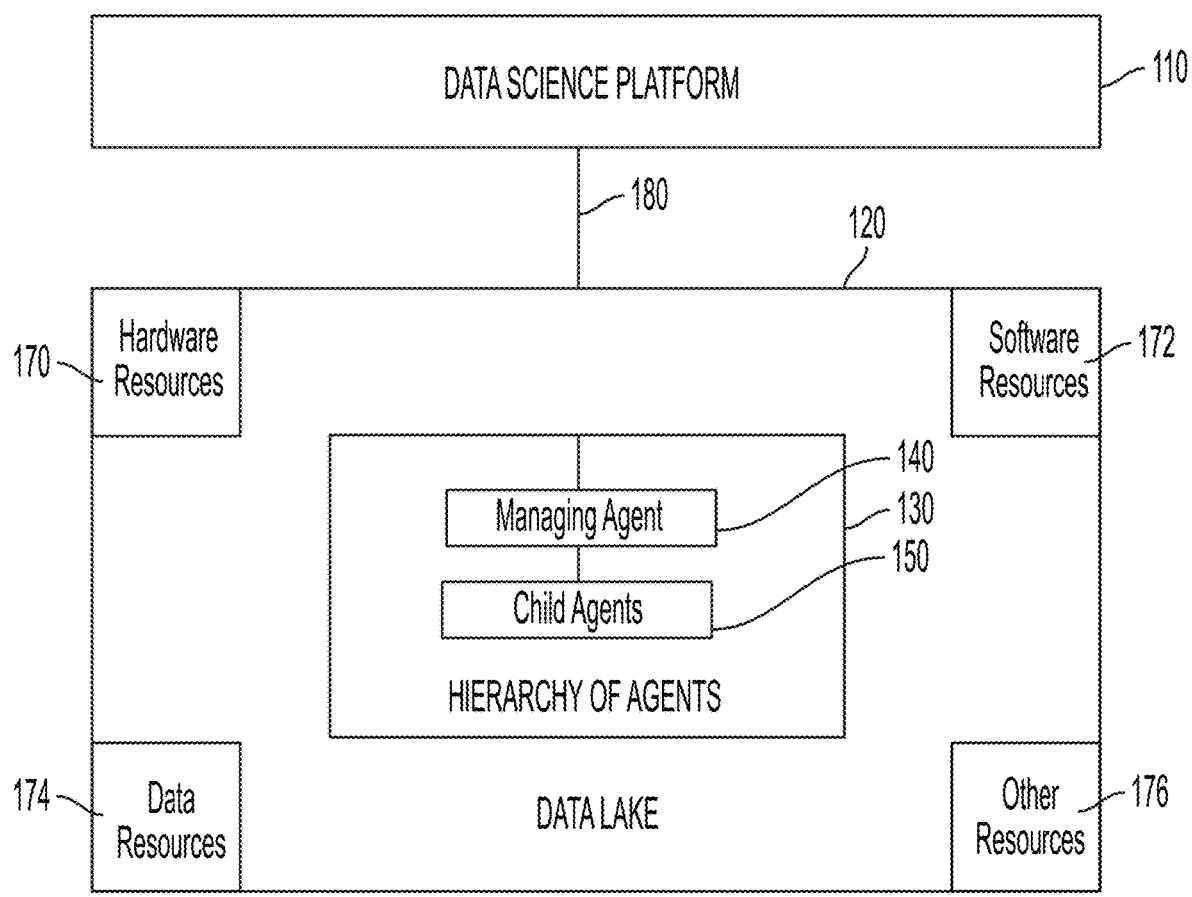
FIG. 1 depicts a data science platform communicatively coupled to a data lake via a communication channel, in accordance with embodiments of the present invention.

Data lakes incorporate one or more enterprise data warehouses with other third-party data sources such as social media, Internet of Things (IoT), public knowledge corpus, relational/non-relational databases, etc. These data sources must be trusted, relevant, and available for all data science users. The addition of an intelligent metadata catalog, which can help relate to terminology, can also bring value to understanding content and organization. An organization usually puts data at the heart of the organization's operation, so that governance, quality control of data, self-service analytics, etc. can be empowered easily using independent technology methods.

Huge amounts of data are typically stored in a data lake. An organization usually needs plenty of hardware/software resources in terms of Central Processing Unit (CPU), Random Access Memory (RAM), storage and networking capabilities for data storage/management and computing power to develop a data science model. In addition, training a data science model requires lots of such data to achieve maximum or sufficiently high accuracy of the data science model, which may be facilitated, at least in part, by connecting a data science platform engine to a data lake layer and running the data science model on the data lake to gain meaningful insight on data lake platform to avoid many challenges caused by moving data from a data lake to a data science platform.

A data lake is typically huge in term of data capacity, so moving data from the data lake to the data science platform layer is a heavy computing utilization task which is avoided by embodiments of the present invention.

A computing capacity of a data lake is typically larger than a computing capacity of a data science platform, so it is not advantageous for an organization to develop a data science model on the data science platform via data training and modeling while the organization is already coupled the data lake layer.

By utilizing data lake resources before, during, and after training, testing and deploying the data science model, embodiments of the present invention achieve benefits provided by the preceding factors of relatively large data capacity and relatively large computing capacity of the data lake.

To design a data science model, data scientists consider multiple aspects such as which software packages and/or programming language should be used and whether there are any dependencies required in software packages or binaries. There are multiple other factors such as what should be the data size (in-line or in-place, independent data warehouse, data type, data structure, etc.) required to train the data science model and how the data size can be analyzed as well as how much it would cost to complete training the data science model to achieve maximum or sufficiently high accuracy of the data science model.

In addition, there are requirements where multiple Machine Learning/Deep Leaning algorithms available for use at the data lake can assist development of the data science model During data science training on the data lake, modeling variables and/or features can vary in accordance with desired or achieved accuracy of the data science models and desired or achieved insight provided by the data science models.

Current use of a data science platform layer lacks intelligence which can help a data scientist to ascertain how much data is required for a data science model to achieve an acceptable accuracy in given time or budget.

Current technology is unable to ascertain what data models are efficient using the data on the data lake and what hardware resources may be beneficially used based on past runs.

There is also no method currently available that can monitor type and quantity of resources consumed during execution of a data science model in real time.

Embodiments of the present invention use an agent-based mechanism for provisioning the data model with required data model variables and hardware resources using agent-based learning at the data lake. Also, agents at the data lake help in monitoring code execution in real time while collecting statistics for future reference by sending the real time statistics to an agent manager.

For example, consider a weather company collecting data about weather conditions from all over the world's weather stations and storing daily/hourly/weekly gathered data to a data lake that is a central location such as the cloud or an on-premises data center. A data scientist, who is designing a data science model, requires weather related data for training and needs to obtain weather data from the data lake. Downloading all of the required data to the data scientist's data science platform before starting the data science model's training would be a costly operation.

For the preceding weather-related case, a data lake architecture in accordance with embodiments of the present invention helps the data scientist to use software at the data lake (e.g., endpoint APIs at the data lake) to run the data science model remotely on the data lake layer without downloading data from the data lake to an on-premises location or wherever the data scientist would train the data science model.

Embodiments of the present invention utilize the data lake efficiently prior to training the data model on data by responding such queries as:
  (i) How much memory/CPU/disk would be required on data lake's hardware platform?
  (ii) How much data is available vs. relevant data required for the data science model to achieve maximum or sufficiently high accuracy?
  (iii) How much time would it take to obtain the maximum or sufficiently high accuracy using available data at the data lake?
  (iv) How can a data model algorithm be tuned to function more efficiently and/or effectively based on availability, at given point of time, of such hardware such as: Central Processing Unit (CPU), Graphics Processing Unit (GPU), Hard Disk Drive (HDD), Solid State Drive (SSD), NonVolatile Memory (NVME), hardware processer architecture such as AMD architecture, Power architecture, Z architecture, etc.
  (v) What is the cost to train a data science model at a given point in time?

Embodiments of the present invention provide a multi-agent system of agents that collectively perform services in the data lake to facilitate training, testing, and deploying a data science model.

The multi-agent system may include an agent for collecting data pertaining to real-time available hardware resources such as, inter alia, CPU, RAM, and hardware data storage (e.g., disk) for training, testing and/or deploying the data science model. Data pertaining to the hardware that may be collected includes:
  (i) CPU cores, CPU class, GPU cores, GPU class, corresponding clock speeds, average CPU utilization per unit time which may be adjusted during model training for minimum impact to a system but having maximum effectiveness as a model feature;
  (ii) available RAM, RAM clock speed, average RAM utilization per unit time which may match the same unit time as with CPU utilization to standardize measurements;
  (iii) available temporary disk, available working disk, I/O statistics for the disk.

The preceding collected data may be used to create a statistical profile for general availability of the hardware resource over time and provide real-time input into the optimization model for training, testing and deploying a data science model.

The multi-agent system may include an agent for collecting real-time data about data available on the data lake based in response to a query received by the agent from the data science platform (e.g., from a data scientist using the data science platform).

Data to be collected in response to the query may be mapped to a semantic model for the target of the trained data model. In other words, specific classification of the data is necessary to be able to map model features to the volume of the data needed to accurately train the model and maximize effectiveness of the trained model.

Other semantic mapping needed may include mapping data segmentation to distributed data storage nodes, which may be needed to match query parameters to the storage node that the query will likely impact.

For example, if the data science model needs to be trained on weather of only one specified city, the query would specify the city and the agent would obtain information denoting how much weather data is available on the data lake for the specified city.

A multi-agent system of the present invention may include an agent for collecting historical data stored on the data lake from previous similar data science models developed and/or deployed on the data lake. Developing a data science model includes, inter alia, training and testing the data science model. Data collected may include inter alia: user CPU percent, system CPU percent, CPU wait times, RAM utilization, and IO utilization. This data may used both for historical measurements and for creating model training features to effectively classify the type of model run, mapping to a semantic layer, and impact of the training run on system resources. New requests, mapped through the semantic layer, will be able to take advantage of artificial intelligence (AI) modeling to map the impact more effectively to the system and, in one embodiment, analyze query cost overall.

The multi-agent system may include an agent for collecting data of a hardware and/or software cost of developing the data science model, including, inter alia, the costing model of dollars per CPU cycle, dollars per terabyte (TB) of data used, etc., which provides static features of nodes on which the data science models will be trained and may be tied to specific clusters/nodes within the data lake.

The multi-agent system may include an agent for detecting a presence of hardware such as, inter alia, GPU, Non-Volatile Random Access Memory (NvRAM), a wire-based serial multi-lane near-range communications link (e.g., NvLink), computational storage, special architecture related optimization algorithms, etc., which provides static features of nodes on which the data science models will be trained and may be tied to specific clusters or nodes within the data lake.

The multi-agent system may include an agent for identifying a programming language specific parameter such as data model training language type or version available on the data lake, specific optimized scientific or mathematical libraries available in the data lake, etc., which provides static features of nodes on which the data science models will be trained and may be tied to specific clusters or nodes within the data lake.

The multi-agent system may include an agent for identifying multiple standard or newly created machine learning and/or deep learning models, which provides static features of nodes on which the data science models will be trained and may be tied to specific clusters or nodes within the data lake.

The multi-agent system may include multiple other agents which can be enabled for the data science platform to assist the data scientist to run data models on the data lake efficiently using prior knowledge of the data lake environment. Also, data science platform agents can help in dynamically selecting or switching agents among the available agents while the data training is being conducted based on requirements in every phase of data training.

Based on the data science model, the data science platform may notify an agent manager of the multi-agent system about the new data science model created before the data science code of the data science model is executed on the data lake. In addition, the data science platform may send, to the agent manager, variables defined in the data science model. In response, the agent manager may notify required agents in the data science platform to become activated for the data science model execution on the lake.

Based on the feature set identified in the data science model, agents may interact among themselves, in accordance with data science model requirements, to gather additional statistics from results of previous executions of the data science model. Also, the agent manager can provision additional sub-agents, based on the received data science model's variables, to query for specific details from the data lake The managing agent may provision Machine Learning Model MLM) or Deep Learning model (DLM) subagents based on the data science model and manage the subagents. A dynamic agent provisioner can create one or multiple MLMs and one or multiple DLMs based on requirements of the data science model.

Based on the gathered relative information from multiple subagents about the data science model, the agent manger can also predict cost before the actual run of the data training, so that data scientist can optimize data or timing requirement for training the data science model.

Data collection agents can also be activated as the code of the data science model is executed on the data lake and can start collecting statistics and send the collected statistics to the managing agent through events/polls/traps once the code execution is completed, after which the data science model may be destroyed in one embodiment.

As part of a data science model training, agents may assess, measure, and track performance of data science workloads with unique statistics and assist in a further deployment phase of the data science model. CPU, memory, and disk utilization statistics and job run-times can be gathered using available agents. A new measurement statistic may be created that captures additional metrics for use in weighted or AI modeled deployment approaches.

Once execution the code of the data science model is completed, data science model agents (e.g., MLM agents and/or DLM agents) can be maintained by the managing agent for future reference with collected statistics for future data modeling and can also help the data scientist to know which model with which variables give better performance with less resources.

The collected statistics may be available individually and can be combined into a feature set for AI based deployment engines. Embodiments of the present invention may use all type of agents for different MLM and DLM workflow execution.

Embodiments of the present invention include the following stages: (i) data exploration at the data lake; (ii) data preprocessing at the data lake; (iii) model development at the data lake; and (iv) model deployment at the data lake or at the data science platform. At each stage performed at the data lake, agents may be employed at the data lake to implement each stage. The data agents may be activated to perform functions automatically in accordance with a specified procedure and/or in response to queries requesting performance of the functions. Such queries may originate from the data science platform or from agents at the data lake.

Data obtained via exploration are used in data modelling. For example, consider a weather prediction data analysis scenario, where model input data obtained historically (e.g., temperature, wind speed, pressure, visibility) are identified for predicting weather humidity at the data lake. Such model input data may be stored at the data lake after being collected from sensors at one or more locations. In various embodiments, the data lake may be in a cloud platform or in a physical data center.

One or more agents at the data lake may participate in identifying such data as model input data, hardware resources, software resources, etc.

For example, a hardware resources agent may receive a query, or be activated automatically, to identify, at the data lake, hardware resources such as CPU cores, CPU class, CPU, GPU, RAM, storage details, The response of the hardware resources agent may be to identify CPU cores, CPU class, GPU cores, GPU class, corresponding clock speeds, average CPU utilization per unit time, RAM size, clock speed, average RAM utilization per unit time, disk type, disk free size, input/output (I/O) statistics for the disk.

As another example for the weather prediction data analysis scenario, a data resources agent may receive a query, or be activated automatically, to identify, at the data lake, data resources which includes model input data such as weather data, data available for a specified city, data size for data model features (e.g., temperature, wind speed, visibility pressure). The response of the data resources agent may be to identify available data size of each data resource, response time for accessing the data size on the data lake.

Data obtained via preprocessing precedes model development which has a training phase followed by a testing phase. A software control agent may receive a query, or be activated automatically, to perform preprocessing by splitting a portion of the model input data into training input data for training the model during the training phase and testing input data for testing the model during the testing phase, using software tools such as Scikit®. Hardware resources identified by the hardware resources agent may be utilized for implementing the preprocessing.

During the training phase, the model is continuously improved until a specified accuracy of the model has been achieved, after which the model is tested in the testing phase in an attempt to confirm that the trained model has achieved the specified accuracy. Various agents may be used in the model development with respect to identifying and using the hardware resources, the software resources, and the data resources that support both the training phase and the testing phase.

Model deployment provides input data into the developed model to produce one or more outputs.

FIG. 1 depicts a data science platform 110 communicatively coupled to a data lake 120 via a communication channel 180, in accordance with embodiments of the present invention.

The data science platform 110 is a computer system used to locate data, extract useful information from the data, and provide the extracted information to applications that may beneficially use the information, train models, and deploy models.

The data lake 120 includes a storage repository that stores raw data in the data's native format until the data is needed. The data lake 120 can accept and retain data from all data sources, can store both structured and unstructured data, does not have a predetermined schema and applies schemas only when the data is ready to be used. In addition, there is no hierarchy or organization among the individual pieces of data in the data lake 120.

The data lake 120 also includes processors (e.g., CPUs) which support data processes (e.g., data import, data movement, data manipulation, data export) used at the data lake.

The data lake 120 includes hardware resources 170, software resources 172, data resources 174, other resources 176, and a hierarchy of agents 130.

The hardware resources 170 include all hardware in the data lake, which may include, inter alia, processors (e.g., CPUs, GPUs), memories (e.g., RAM), hardware data repositories (e.g., disk), and other hardware than can be used in a computer system.

The software resources 172 include all software in the data lake, which may include, inter alia, an operating system, applications, modelling software, model optimization software, etc.

The data resources 174 include all data in the data lake, which may include, inter alia, model input data.

The other resources 176 include all other resources in the data lake.

Figure 2:
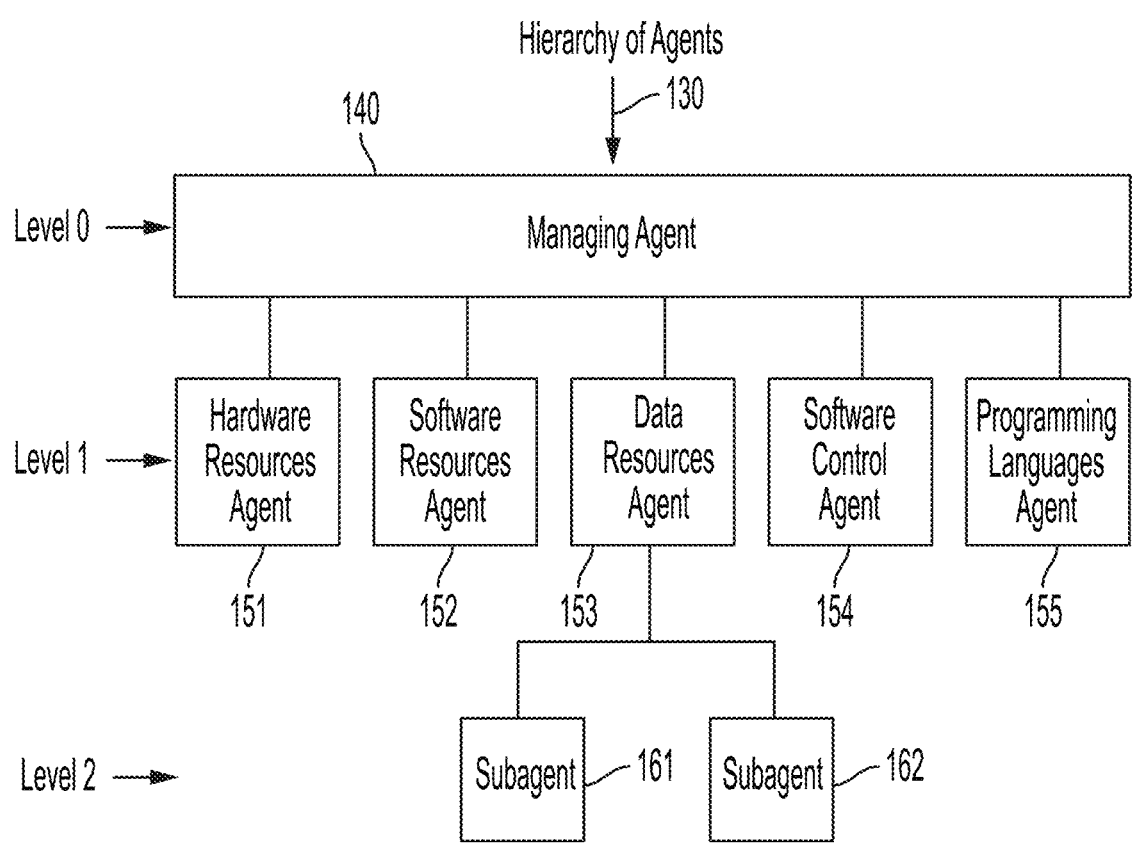
FIG. 2 depicts a hierarchy of agents, in accordance with embodiments of the present invention.

The hierarchy of agents 130 is a hierarchical nodal structure including a managing agent 140 and child agents 150. The managing agent 130 is at a root node at level 0 in the hierarchy 130 and the child agents 150 are at levels 1, 2, . . . below the root node in the hierarchy 130 as depicted in FIG. 2, described infra. The managing agent 130 may create, destroy, supervise, and control the child agents 150. Each agent of the hierarchy of agents 130 is configured to perform a specialized function.

FIG. 2 depicts the hierarchy of agents 130, in accordance with embodiments of the present invention.

The hierarchy of agents 130 has hierarchical levels 0, 1, 2, . . . . Although FIG. 2 depicts levels 0, 1, and 2, the hierarchy of agents 130 may have any number of additional levels lower than level 2 (e.g., level 3, level 4, etc.). Each agent is at a node of the hierarchy 130.

The managing agent 130 is at a root node at level 0 of the hierarchy 130.

In one embodiment, the managing agent 130 is created at the data science platform 110, or at any other computer system, and subsequently transmitted to the data lake 120.

In one embodiment, the managing agent 130 is created at the data lake by the managing node of another hierarchy of agents.

The agents at level 1 include a hardware resources agent 151, a software resources agent, 152, a data resources agent, 153, a software control agent 154, a programming languages agent 155, and any other agent.

The hardware resources agent 151 performs functions pertaining to the hardware resources 170 (FIG. 1) such as, inter alia, identifying hardware resources and properties of the hardware resources (e.g., CPU cores, CPU class, GPU cores, GPU class, corresponding clock speeds, average CPU utilization per unit time, available RAM, RAM clock speed, average RAM utilization per unit time which may match the same unit time as with CPU utilization to standardize measurements, available temporary disk, available working disk, I/O statistics for the disk), installing hardware resources, removing hardware resources, upgrading hardware, creating subagents to perform any of the preceding functions, and destroying such subagents.

The software resources agent 152 performs functions pertaining to the software resources 172 (FIG. 1) such as, inter alia, identifying software resources and properties of the software resources (i.e., any program code such as, inter alia, endpoint application programming interfaces (APIs), Scikit®, optimization software, etc.), installing software resources, removing software resources, upgrading software, creating subagents to perform any of the preceding functions, and destroying such subagents.

The data resources agent 153 performs functions pertaining to the data resources 174 (FIG. 1) such as, inter alia, identifying data resources and properties of the data resources (i.e., any data), importing data, exporting data, replacing data, creating subagents to perform any of the preceding functions, and destroying such subagents.

The software control agent 154 performs functions pertaining to the controlling software such as, inter alia, initiating execution of software, terminating execution of software, creating subagents to perform any of the preceding functions, and destroying such subagents.

The programming languages agent 155 performs functions pertaining to programming languages (e.g., python °, java) such as, inter alia, identifying programming languages stored on the data lake, creating subagents to perform any of the preceding function, destroying such subagents.

Additional agents may exist at level 1 as needed.

In one embodiment, each agent at level 1 is created by the managing agent 140.

In one embodiment, each agent at level 1 is created at the data science platform, or at any other computer system, and subsequently transmitted to the data lake 120.

At level 2, subagents 161 and 162 have a parent agent, namely the data resources agent 153. In general, the data resources agent 153 may have any number (1, 2, 3, ... ) of child agents at level 2. Alternatively, the data resources agent 153 may be at a leaf node and thus be terminating agent with no child agents.

The subagents 161 and 162 each may be at a leaf node or have one or more child nodes at level 3. Similarly, each subagent at level 3 each may be at a leaf node or have one or more child nodes at level 4 and so on for lower levels 5, 6, etc.

Each agent at level 1 may have the same child agent embodiments as described supra for the data resources agent 153.

Generally, each given child subagent or agent at level n (n=1, 2, 3, 4, ... ) may be created or destroyed by any parent subagent or agent of the given child subagent or agent, or by the data science platform 110. For example, a child subagent at level 3 may be created or destroyed by any of the parent agents at levels 2, 1, or 0.

In this example, the data resources agent 153 may create and destroy any of the child nodes of data resources agent 153 at any level 2, 3, 4, etc., but may not, in one embodiment, create and destroy child nodes of any other agent at level 1.

In addition, each agent or subagent at any of the levels m (1, 2, 3, ... ) may create and destroy another agent or subagent at the same level m for the same parent agent. For example, child subagent 161 at level 2 may create and destroy subagent 162 at level 2 for the parent data resources agent 153 at level 1, but may not, in one embodiment, create and destroy a child subagent of the hardware resources agent 151 at level 1.

In one embodiment, each agent in the hierarchy 130 can instruct any other agent in the hierarchy 130 to perform any function that the other agent is configured to perform.

Figure 3:
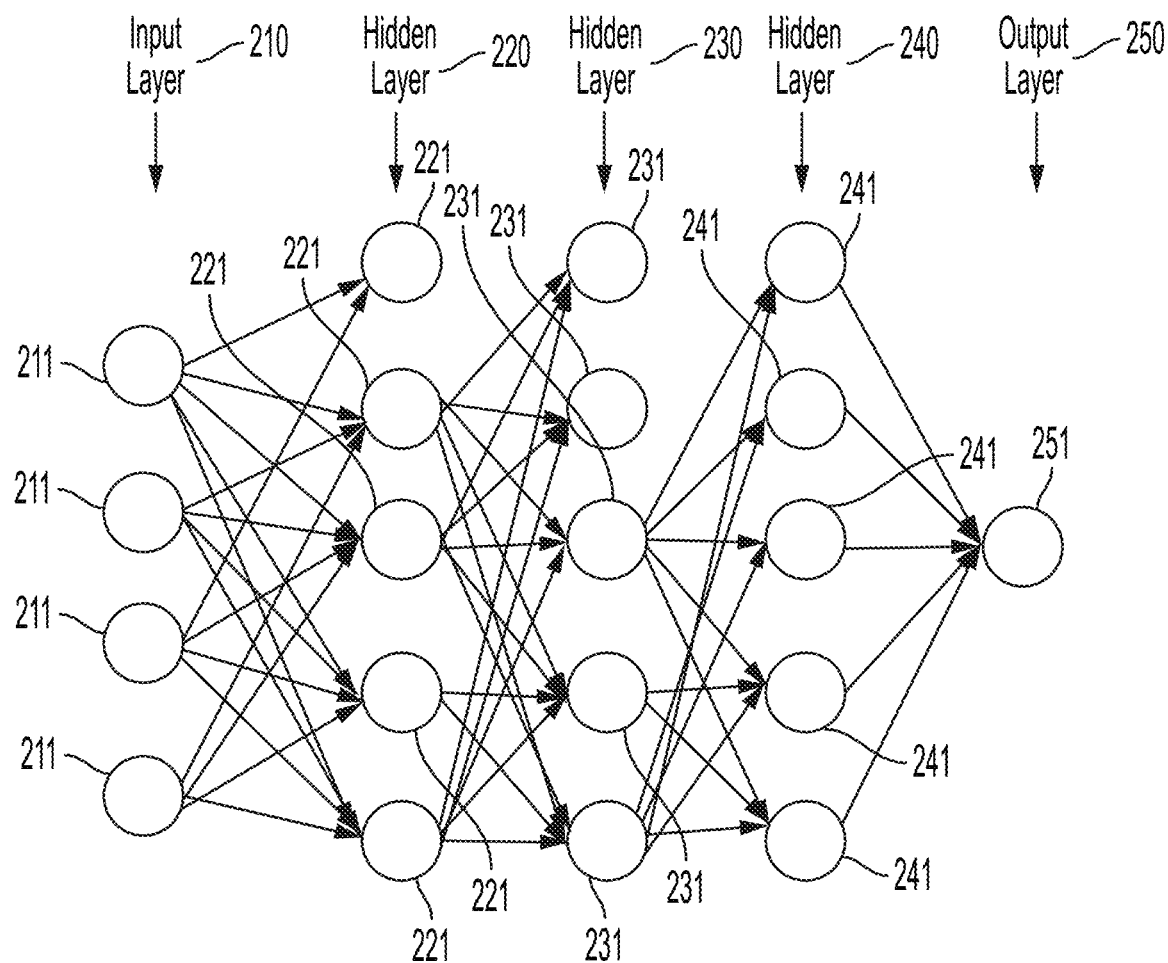
FIG. 3 depicts an exemplary artificial neural network (ANN) used to develop a model, in accordance with embodiments of the present invention.

FIG. 3 depicts an exemplary artificial neural network (ANN) used to develop a model, in accordance with embodiments of the present invention.

The layers in the ANN include an input layer 210 comprising nodes 211, hidden layers 220, 230 and 240 comprising nodes 221, 231 and 241, respectively, and an output layer 230 comprising output node 231. The nodes 211, 221, 231, 241 and 251 are also called neurons.

Generally, the ANN can have one or more nodes in the input layer, one or more hidden layers, one or more nodes in each hidden layer, and one or more nodes in the output layer.

For the weather scenario, the 4 input nodes 211 pertain to temperature, wind speed, pressure, and visibility, and the output node 251 pertains to humidity. In a related example, there could be only 3 input nodes pertaining temperature, wind speed, and pressure. In another related example, there could be 2 output nodes pertaining to humidity and wind speed.

There is a weight to be determined between each pair of connected nodes in the ANN. For example, in FIG. 3, there are 17 weights between the input layer 210 and the first hidden layer 220 (i.e., 5, 5, 3 and 4 connections between the 4 nodes 211 of the input layer 210 and the 5 nodes 221 of the first hidden layer 220). Similarly, there are weights to be determined between each pair of connected nodes in the hidden layers 220, 230 and 240, and a weight to be determined between each pair of connected nodes in the last hidden layer 240 and the nodes of the output layer 250, In addition, each node of the one or more hidden layers 220, 230 and 240 has a bias. For a given node 221 of the first hidden layer 220, a summation over weighted values of the input nodes 211 that are connected to the given node 221 of the first hidden layer 221 is computed, using the weights between the given node 221 of the first hidden layer 220 and the values of the input nodes 211 that are connected to the given node 221 of the first hidden layer. The computed summation is incremented by the bias of the given node 211 of the first hidden layer 210. The incremented summation is fed into an activation function (e.g., sigmoid function, hyperbolic tangent function, rectified linear function, etc.) and the output from the activation function becomes the value of the given node 221 of the first hidden layer 220. The preceding process is repeated for all other nodes 221 of the first hidden layer 220.

The preceding process is sequentially repeated between the successive layers in each pair of successive layers of the hidden layers 220, 230, and 240 until all nodes in the hidden layers 820 contain values of weights.

The preceding process is repeated between the last hidden layer 240 and the output layer 250 until all nodes in the output layer 250 contain values. In FIG. 3, the output layer 250 contains one output node 251.

The model development has a training phase followed by a testing phase. During the training phase the model is continuously improved until a specified accuracy of the model has been achieved, after which the model is tested in the testing phase in an attempt to confirm that the trained model has achieved the specified accuracy. Various agents may be used in the model development with respect to identifying and using the hardware resources, the software resources, and the data resources that support the model development.

Training data, namely a portion of the model input data, is used to train the ANN in the training phase. Training the ANN with the training data is a process in which the weights are selected randomly initially and the biases are set to zero initially. The weights and biases are changed in successive training iterations in a manner that successively reduces a loss function with respect to variations between the predicted output and the actual output.

The training phase includes an iterative process. In each iteration of the iterative process, the model is trained using the model input data as training data, followed by validating the trained model using validation input data. The model's accuracy is increased in each successive iteration and the iterative process uses the hardware resources, a data model training language, and software resources.

The training iterative process ends at a final iteration of the iterative process if during the final iteration the validating determines that a specified target accuracy of the model has been achieved.

Model deployment provides input data into the developed model to produce one or more outputs.

Figure 4:
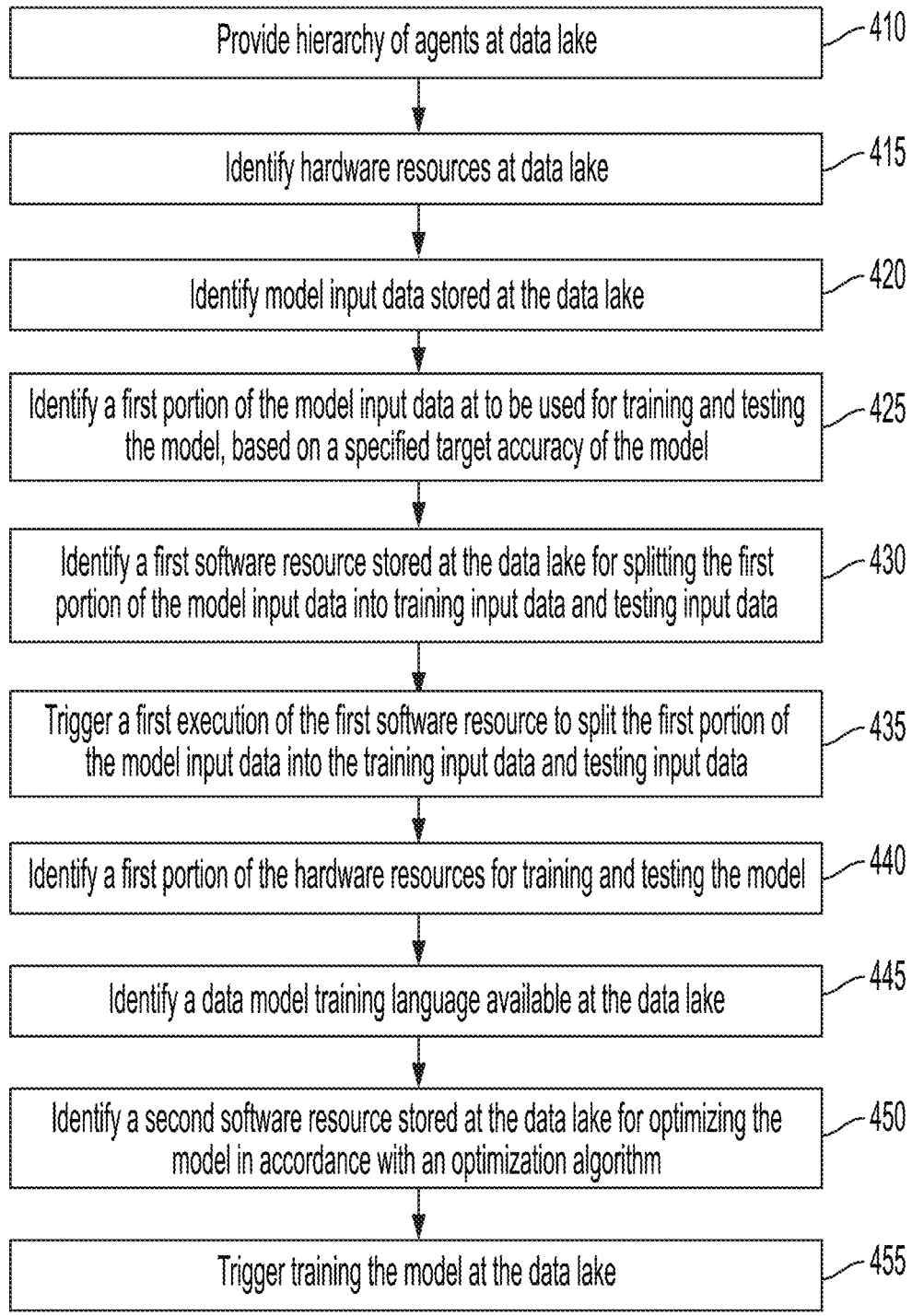
FIG. 4 is a flow chart describing a method of using agents at the data lake to assist training, testing, and deploying a model for predicting one or more outputs from specified input to the model, in accordance with embodiments of the present invention.

FIG. 4 is a flow chart describing a method of using agents at the data lake 120 to assist training, testing, and deploying a model for predicting one or more outputs from specified input to the model, in accordance with embodiments of the present invention. The model originated at the data science platform 110 communicatively coupled to the data lake 120. The flow chart of FIG. 4 includes steps 410-455.

Step 410 provides at the data lake 120, the hierarchy of agents 130 with a managing agent 140 at a root node at level 0 of the hierarchy 130 and multiple first level agents at respective nodes at a first level of the hierarchy 130. Each first level agent is a child agent of the managing agent 140. The first level agents include a hardware resources agent 151, a software resources agent 152, a data resources agent 153, a software control agent 154, and a programming languages agent 155.

Step 415 identifies, by the hardware resources agent 151, a plurality of hardware resources stored at the data lake 120 and physical characteristics of each hardware resource. Each hardware resource is usable for training and testing the model.

Step 420 identifies, by the data resources agent 153, model input data stored at the data lake 120 and access speed for accessing the model input data and portions of the input data distributed in different storage locations in the data lake. The model input data includes data usable as the specified input to the model.

Step 425 identifies, based on a specified target accuracy of the model, a first portion of the model input data to be used for training and testing the model.

Step 430 identifies, by the software resources agent 152, a first software resource stored at the data lake 120. The first software resource is program code configured to split the first portion of the model input data into training input data for training the model and testing input data for testing the model.

Step 435 triggers, by the software control agent 154, a first execution at the data lake 120 of the first software resource to split the first portion of the model input data into the training input data and the testing input data.

Step 440 identifies, by the hardware resources agent 151, a first portion of the hardware resources available to be used for training and testing the model. The identifying of first portion of the hardware resources is based on a size of the first portion of model input data, the access speed for accessing the first portion of the model input data, and the physical characteristics of the hardware resources.

Step 445 identifies, by the programming languages agent 155, a data model training language available at the data lake 120.

Step 450 identifies, by the software resources agent 152, a second software resource stored at the data lake 120. The second software resource is program code configured to be used for optimizing the model in accordance with an optimization algorithm used during said training the model.

Step 455 triggers, by the software control agent 154, training the model at the data lake 120 using the training input data, the first portion of the hardware resources, the data model training language, and the second software resource.

FIGS. 5-13 are each a flow chart of a process relating to the method described in FIG. 4, in accordance with embodiments of the present invention.

Figure 5:
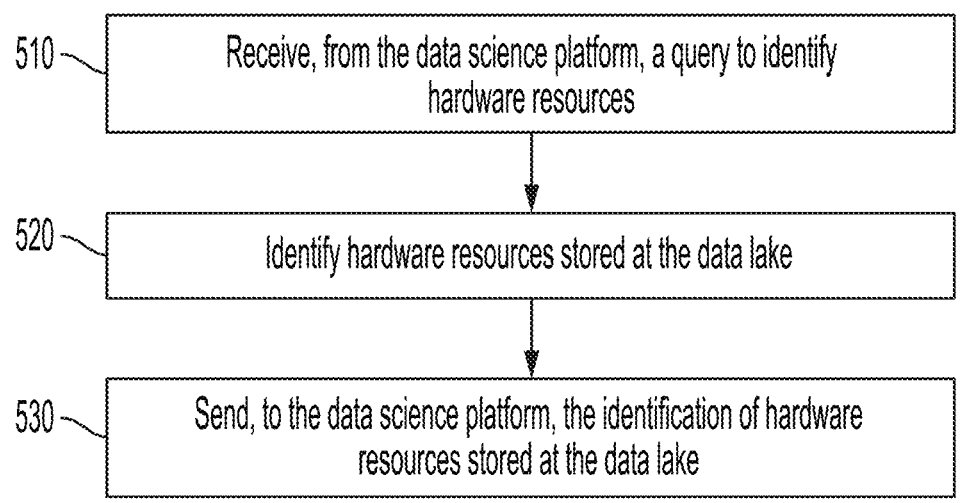
FIGS. 5-13 are each a flow chart of a process relating to the method described in FIG. 4, in accordance with embodiments of the present invention.

FIG. 5 is a flow chart of a process that enhances the method of FIG. 4 via steps 510, 520 and 530.

Step 510 receives from the data science platform 110, by the hardware resources agent 151, a query to identify hardware resources stored at the data lake 120 and physical characteristics of each hardware resource.

In step 520 in response to the received query to identify hardware resources stored at the data lake 120 and physical characteristics of each hardware resource, the hardware resources agent 151 identifies the plurality of hardware resources stored at the data lake 120 and physical characteristics of each hardware resource.

Step 530 sends to the data science platform 110, by the hardware resources agent 151, an identification of the plurality of hardware resources stored at the data lake and an identification of physical characteristics of each hardware resource.

Figure 6:
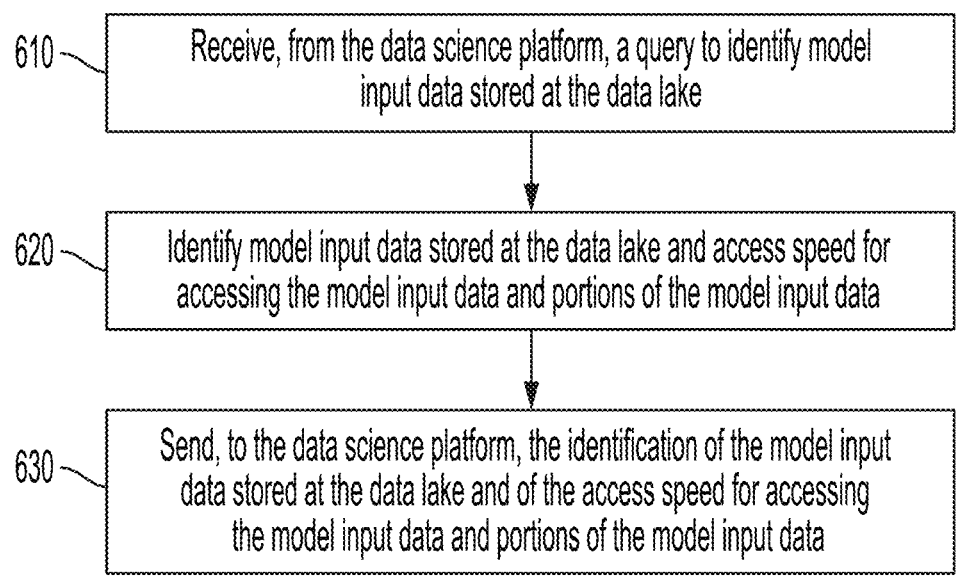

FIG. 6 is a flow chart of a process that enhances the method of FIG. 5 via steps 610, 620 and 630.

Step 620 receives from the data science platform 110, by the data resources agent 153, a query to identify the model input data stored at the data lake 120.

In step 620 in response to the received query to identify the model input data stored at the data lake 120, the data resources agent identifies: the model input data stored at the data lake, an access speed for accessing the model input data, and portions of the model input data distributed in different storage locations in the data lake.

Step 630 sends to the data science platform 110, by the hardware resources agent 151, an identification of: the model input data stored at the data lake 120, the access speed for accessing the model input data, and portions of the model input data distributed in different storage locations in the data lake.

Figure 7:
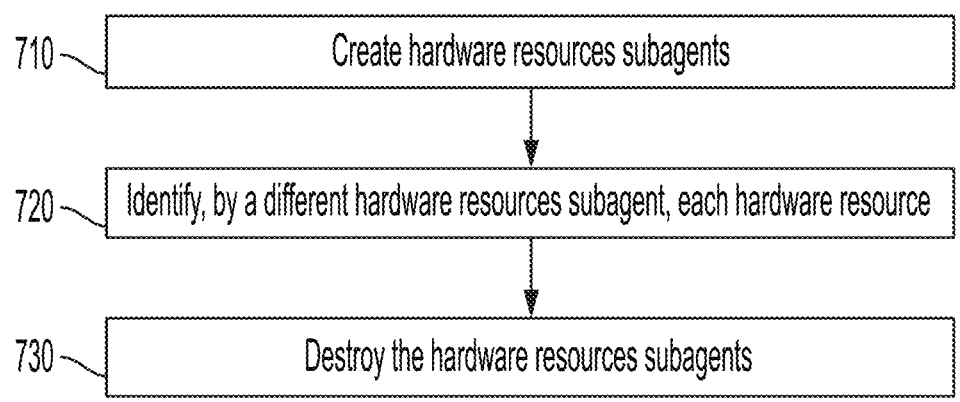

FIG. 7 is a flow chart of a process that implements an embodiment of step 415 in FIG. 4 (identification of the plurality of hardware resources) via steps 710, 720 and 730.

Step 710 creates, by the hardware resources agent 151, a plurality of hardware resources subagents of the hardware resources agent.

Step 720 identifies, by a different hardware resources subagent of the plurality of hardware resources subagents, each hardware resource of the plurality of hardware resources.

In step 730 after each hardware resource of the plurality of hardware resources is identified, the hardware resources agent destroys the plurality of hardware resources subagents.

Figure 8:
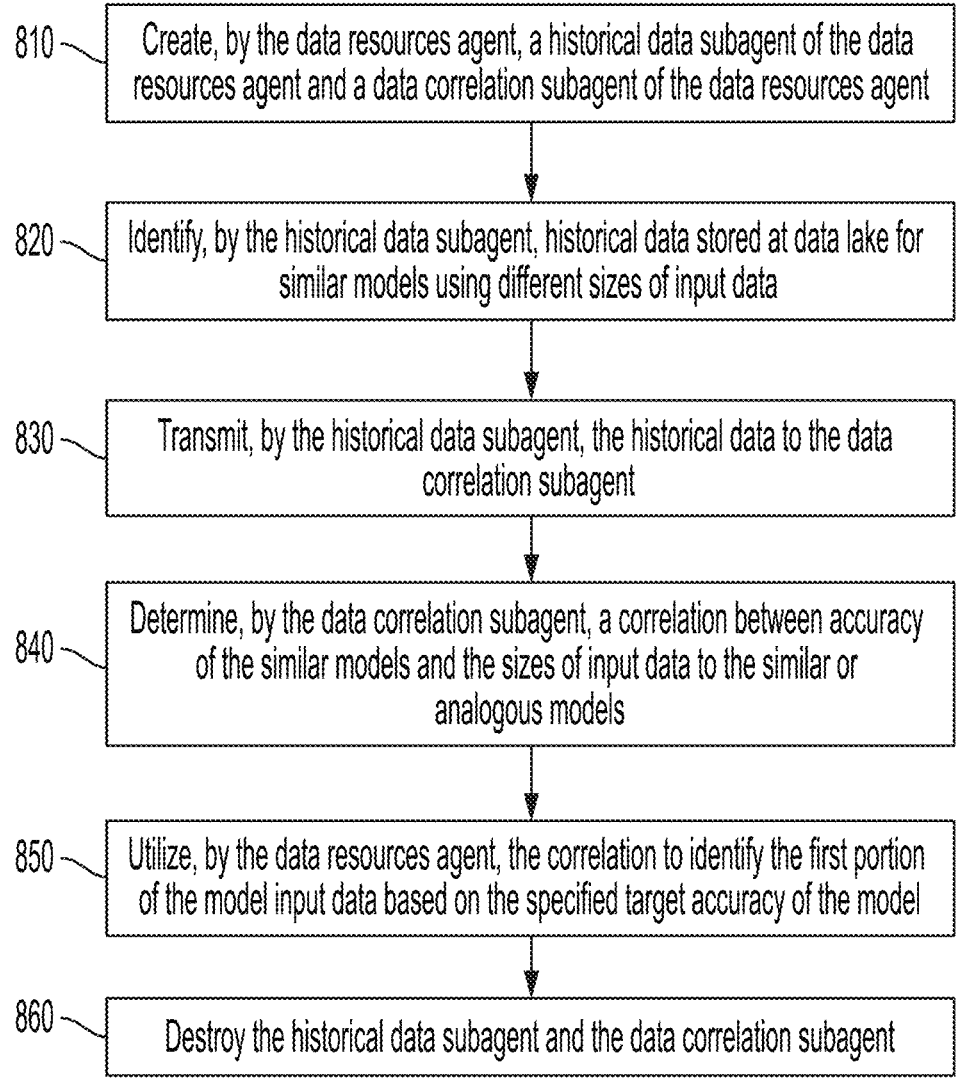

FIG. 8 is a flow chart of a process that implements an embodiment of step 425 in FIG. 4 (identification of, by the data resources agent 153, the first portion of the model input data based on the specified target accuracy of the model) via steps 810-860.

Step 810 creates, by the data resources agent 153, a historical data subagent of the data resources agent 153 and a data correlation subagent of the data resources agent 153.

Step 820 identifies, by the historical data subagent, historical data stored at data lake 120 for similar models using different sizes of input data.

Step 830 transmits, by the historical data subagent, the historical data to the data correlation subagent.

Step 840 determines, by the data correlation subagent using the historical data, a correlation between accuracy of the similar models and the sizes of input data to the similar models. The historical data is used for determining the correlation.

Step 850 utilizes, by the data resources agent 153, the correlation to identify the first portion of the model input data based on the specified target accuracy of the model.

After utilizing the correlation, step 860 destroys the historical data subagent and the data correlation subagent.

In one embodiment of step 860, after the correlation is utilized, the data resources agent 153 destroys the historical data subagent and the data correlation subagent.

In one embodiment of step 860, after the correlation is utilized, the data resources agent 153 receives an instruction from the managing agent 140 to destroy the historical data subagent and the data correlation subagent and subsequently destroys the historical data subagent and the data correlation subagent.

In one embodiment of step 860, after the correlation is utilized, the managing agent 140 receives the instruction to destroy the historical data subagent and the data correlation subagent. Then, the data resources agent 153 receives an instruction from the managing agent 140 to destroy the historical data subagent and the data correlation subagent. Then, data resources agent 153 destroys the historical data subagent and the data correlation subagent.

Figure 9:
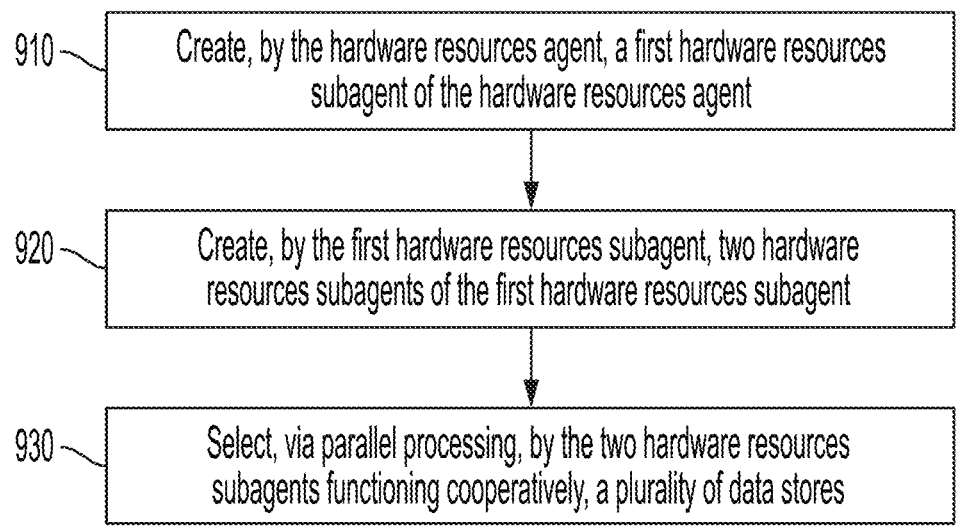

FIG. 9 is a flow chart of a process that implements an embodiment of step 440 in FIG. 4 (identification of the first portion of the hardware resources) via steps 910, 920 and 930 under the following conditions: the hardware resources includes multiple data stores at the data lake 120, physical characteristics of each data store is specific to each data store, and the model input data includes a plurality of sets of model input data stored in respective data stores of the multiple data stores.

Step 910 creates, by the hardware resources agent, a first hardware resources subagent of the hardware resources agent.

Step 920 creates, by the first hardware resources subagent, two hardware resources subagents of the first hardware resources subagent.

Step 930 selects via parallel processing, by the two hardware resources subagents functioning cooperatively, a plurality of data stores of the respective data stores based at least in part on the access speed for accessing each set of the plurality of sets of model input data from the respective data store of the multiple data stores. The plurality of data stores is fewer data stores than a total number of the respective data stores. The first portion of the hardware resources the plurality of data stores.

Figure 10:
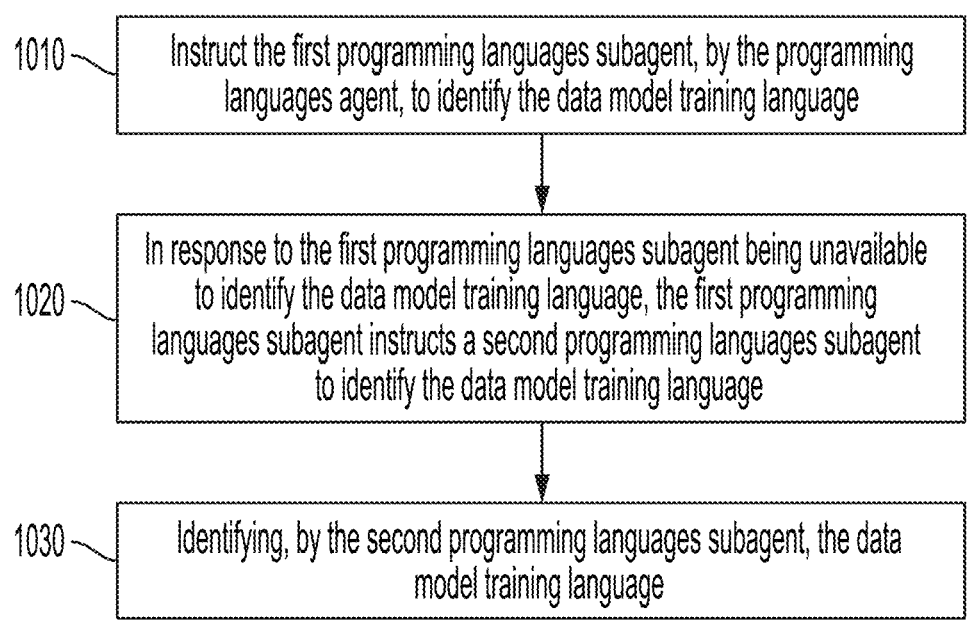

FIG. 10 is a flow chart of a process that implements an embodiment of step 445 in FIG. 4 (identification of the data model training language by the programming languages agent 155) via steps 1010, 1020 and 1030 under the following conditions: the hierarchy 130 includes a first programming languages subagent of the programming languages agent 155 and a second programming languages subagent of the programming languages agent 155.

Step 1010 instructs the first programming languages subagent, by the programming languages agent 155, to identify the data model training language.

In response to the first programming languages subagent being unavailable to identify the data model training language, the first programming languages subagent instructs, in step 1020, the second programming languages subagent to perform identifying the data model training language.

In response to the instructing of the second programming languages subagent, the second programming languages subagent identifies, in step 1030, the data model training language.

Figure 11:
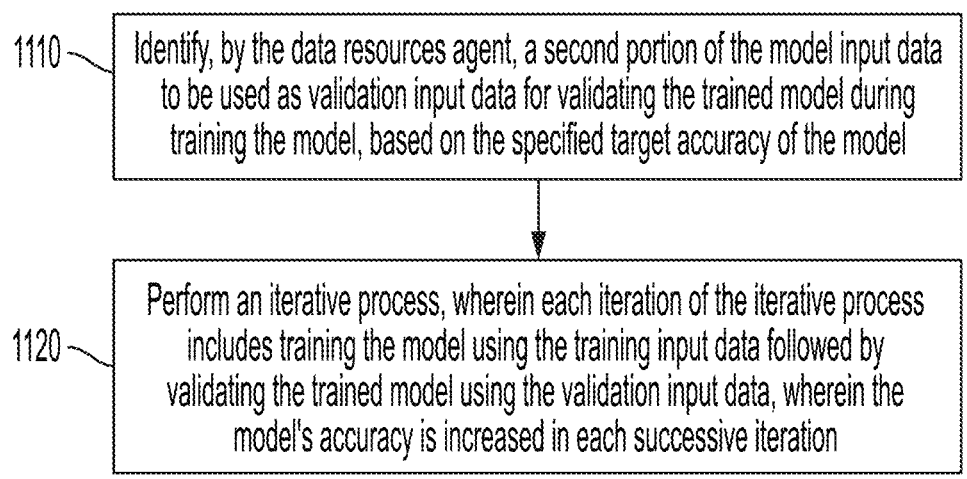

FIG. 11 is a flow chart of a process that implements an embodiment of step 455 in FIG. 4 (training the model) via steps 1110 and 1120.

Step 1110 identifies based on the specified target accuracy of the model, by the data resources agent 153, a second portion of the model input data to be used as validation input data for validating the trained model during said training the model.

Step 1120 performs an iterative process. Each iteration of the iterative process includes training the model using the training input data, followed by validating the trained model using the validation input data. The model's accuracy is increased in each successive iteration. The iterative process uses the first portion of the hardware resources, the data model training language, and the second software resource. The iterative process ends at a final iteration of the iterative process if during the final iteration the validating determines that the specified target accuracy of the model has been achieved.

Figure 12:
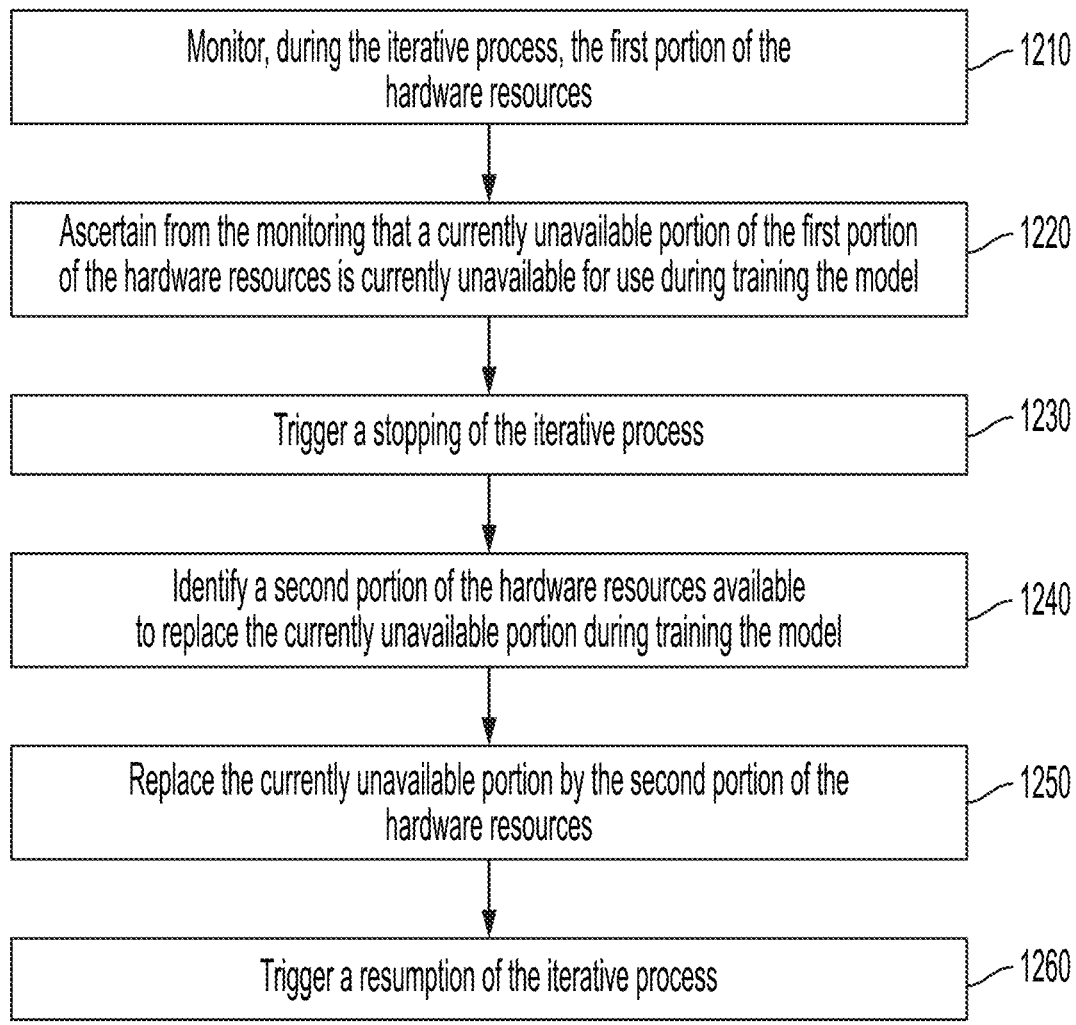

FIG. 12 is a flow chart of a process that enhances the method of FIG. 11 via steps 1210-1260.

Step 1210 monitors during the iterative process, by the hardware resources agent 151, the first portion of the hardware resources.

Step 1220 ascertains from the monitoring, by the hardware resources agent 151, that a currently unavailable portion of the first portion of the hardware resources is currently unavailable for use during said training the model.

Step 1230 triggers, by the software control agent 154 in response to the ascertaining, stopping the iterative process After the iterative process is stopped, step 1240 identifies, by the hardware resources agent, a second portion of the hardware resources available to replace the currently unavailable portion during training the model. The second portion of the hardware resources is identified based on the unavailable portion of the first portion of the hardware resources, the access speed for accessing the first portion of the model input data, and the physical characteristics of the hardware resources.

Step 1250 replaces, by the hardware resources agent 151, the currently unavailable portion by the second portion of the hardware resources, after which step 1260 triggers, by the software control agent 154, a resumption of the iterative process.

Figure 13:
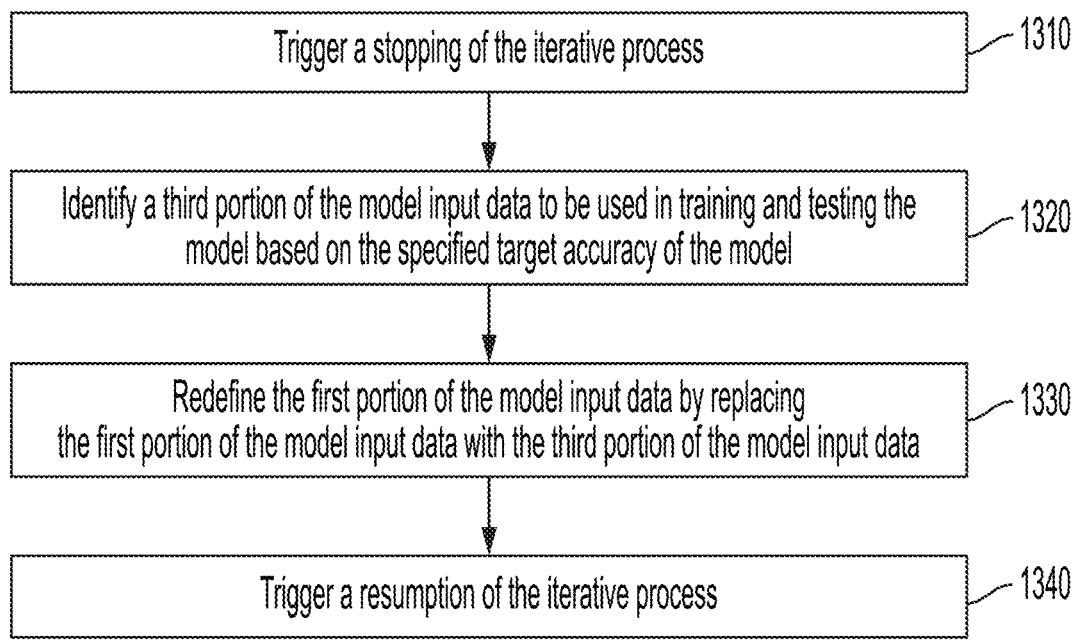

FIG. 13 is a flow chart of a process that enhances the method of FIG. 12 via steps 1310-1340 under the following conditions: after a specified iteration of the iterative process, the validating determines that the specified target accuracy of the model has not been achieved.

Step 1310 triggers, by the software control agent 154, stopping the iterative process.

After the iterative process is stopped, step 1320 identifies, by the data resources agent 153, a third portion of the model input data to be used in training and testing the model based on the specified target accuracy of the model. The third portion of the model input data is larger than the first portion of the model input data.

Step 1330 redefines, by the data resources agent 153, the first portion of the model input data by replacing the first portion of the model input data with the third portion of the model input data Following redefining the first portion of the model input data, step 1340 triggers, by the software control agent 154, a resumption of the iterative process In one embodiment of step 1320, the third portion of the model input data includes a subset of the first portion of the model input data.

In one embodiment of step 1320, the first and third portions of the model input data are mutually exclusive.

In one embodiment, after the model has been trained, the software control agent 154 triggers testing the model in the data lake using the testing input data and the first portion of the hardware resources.

In one embodiment, the data resources agent 153 receives, from the data science platform 1110, new input data for deploying the mode, and after the model has been tested, the software control agent 154 triggers deploying the model using the received new input data.

Figure 14:
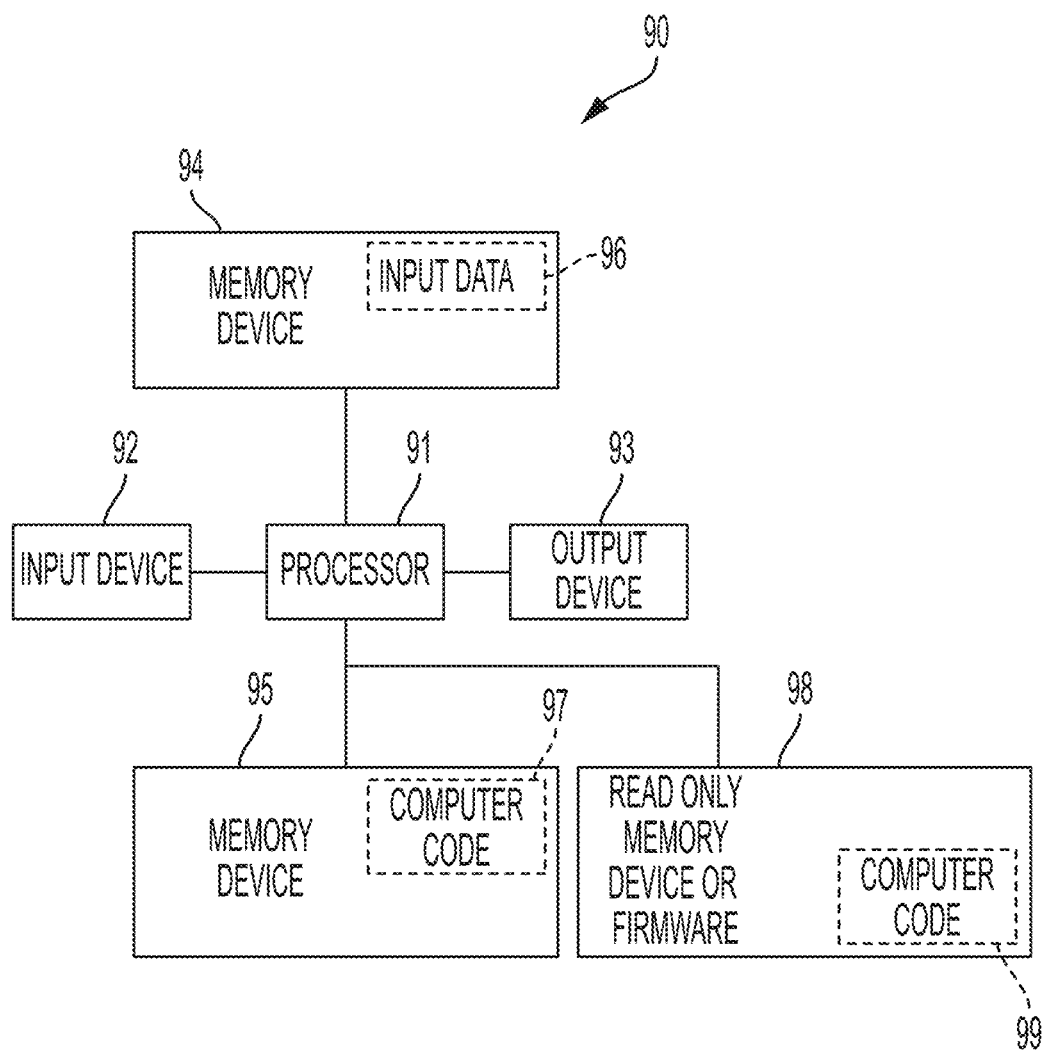
FIG. 14 illustrates a computer system, in accordance with embodiments of the present invention.

FIG. 14 illustrates a computer system 90, in accordance with embodiments of the present invention.

The computer system 90 includes a processor 91, an input device 92 coupled to the processor 91, an output device 93 coupled to the processor 91, and memory devices 94 and 95 each coupled to the processor 91. The processor 91 represents one or more processors and may denote a single processor or a plurality of processors. The input device 92 may be, inter alia, a keyboard, a mouse, a camera, a touchscreen, etc., or a combination thereof. The output device 93 may be, inter alia, a printer, a plotter, a computer screen, a magnetic tape, a removable hard disk, a floppy disk, etc., or a combination thereof. The memory devices 94 and 95 may each be, inter alia, a hard disk, a floppy disk, a magnetic tape, an optical storage such as a compact disc (CD) or a digital video disc (DVD), a dynamic random access memory (DRAM), a read-only memory (ROM), etc., or a combination thereof. The memory device 95 includes a computer code 97. The computer code 97 includes algorithms for executing embodiments of the present invention. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices such as read only memory device 96) may include algorithms and may be used as a computer usable medium (or a computer readable medium or a program storage device) having a computer readable program code embodied therein and/or having other data stored therein, wherein the computer readable program code includes the computer code 97. Generally, a computer program product (or, alternatively, an article of manufacture) of the computer system 90 may include the computer usable medium (or the program storage device).

In some embodiments, rather than being stored and accessed from a hard drive, optical disc or other writeable, rewriteable, or removable hardware memory device 95, stored computer program code 98 (e.g., including algorithms) may be stored on a static, nonremovable, read-only storage medium such as a Read-Only Memory (ROM) device 99, or may be accessed by processor 91 directly from such a static, nonremovable, read-only medium 99. Similarly, in some embodiments, stored computer program code 97 may be stored as computer-readable firmware 99, or may be accessed by processor 91 directly from such firmware 99, rather than from a more dynamic or removable hardware data-storage device 95, such as a hard drive or optical disc.

Still yet, any of the components of the present invention could be created, integrated, hosted, maintained, deployed, managed, serviced, etc. by a service supplier who offers to improve software technology associated with cross-referencing metrics associated with plug-in components, generating software code modules, and enabling operational functionality of target cloud components. Thus, the present invention discloses a process for deploying, creating, integrating, hosting, maintaining, and/or integrating computing infrastructure, including integrating computer-readable code into the computer system 90, wherein the code in combination with the computer system 90 is capable of performing a method for enabling a process for improving software technology associated with cross-referencing metrics associated with plug-in components, generating software code modules, and enabling operational functionality of target cloud components. In another embodiment, the invention provides a business method that performs the process steps of the invention on a subscription, advertising, and/or fee basis. That is, a service supplier, such as a Solution Integrator, could offer to enable a process for improving software technology associated with cross-referencing metrics associated with plug-in components, generating software code modules, and enabling operational functionality of target cloud components. In this case, the service supplier can create, maintain, support, etc. a computer infrastructure that performs the process steps of the invention for one or more customers. In return, the service supplier can receive payment from the customer(s) under a subscription and/or fee agreement and/or the service supplier can receive payment from the sale of advertising content to one or more third parties.

While FIG. 14 shows the computer system 90 as a particular configuration of hardware and software, any configuration of hardware and software, as would be known to a person of ordinary skill in the art, may be utilized for the purposes stated supra in conjunction with the particular computer system 90 of FIG. 14. For example, the memory devices 94 and 95 may be portions of a single memory device rather than separate memory devices.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A computer program product of the present invention comprises one or more computer readable hardware storage devices having computer readable program code stored therein, said program code containing instructions executable by one or more processors of a computer system to implement the methods of the present invention.

A computer system of the present invention comprises one or more processors, one or more memories, and one or more computer readable hardware storage devices, said one or more hardware storage devices containing program code executable by the one or more processors via the one or more memories to implement the methods of the present invention.

Cloud Computing Environment

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 15:
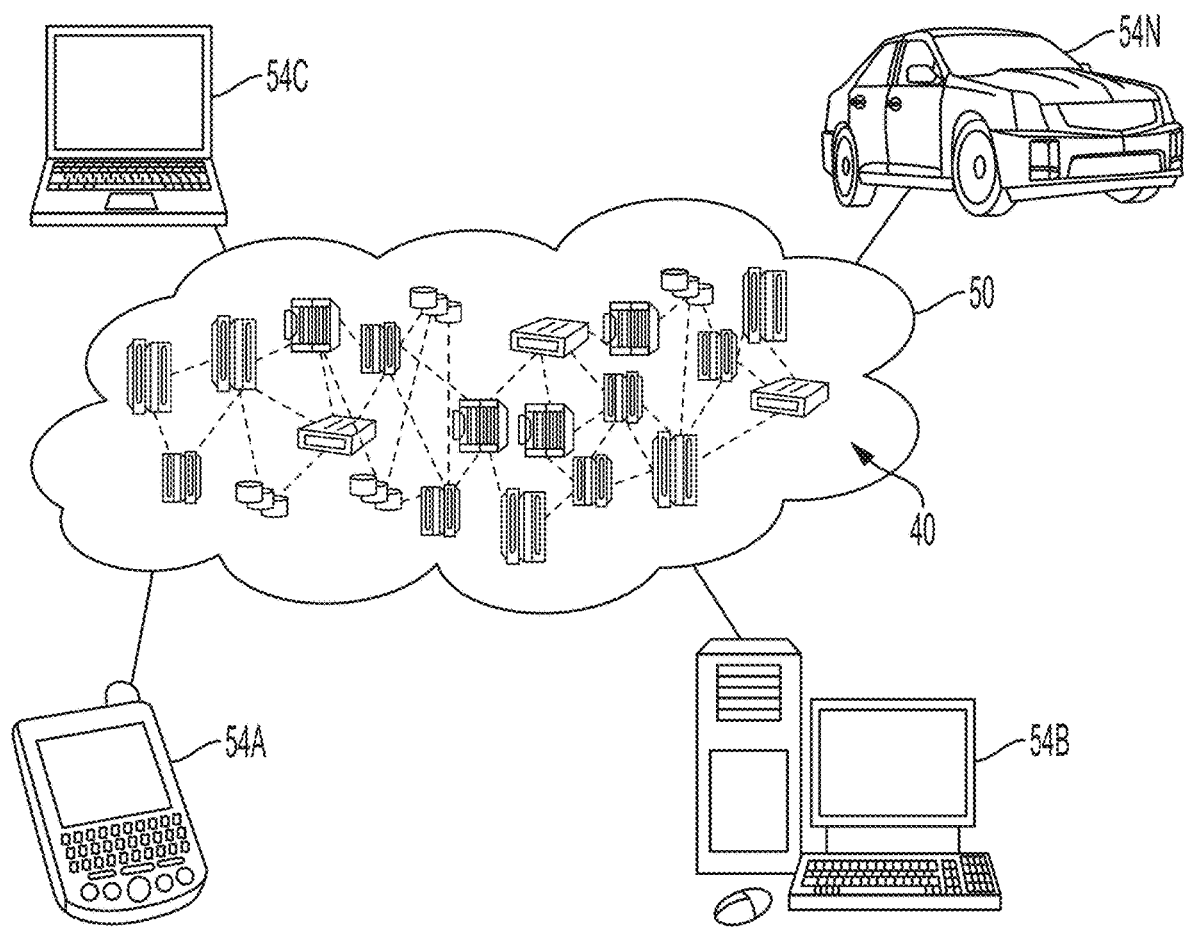
FIG. 15 depicts a cloud computing environment, in accordance with embodiments of the present invention.

Referring now to FIG. 15, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 40 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 15 are intended to be illustrative only and that computing nodes 10 and cloud computing environment 50 can communicate with any type of computerized device over any type of network and/or network addressable connection (e.g., using a web browser).

Figure 16:
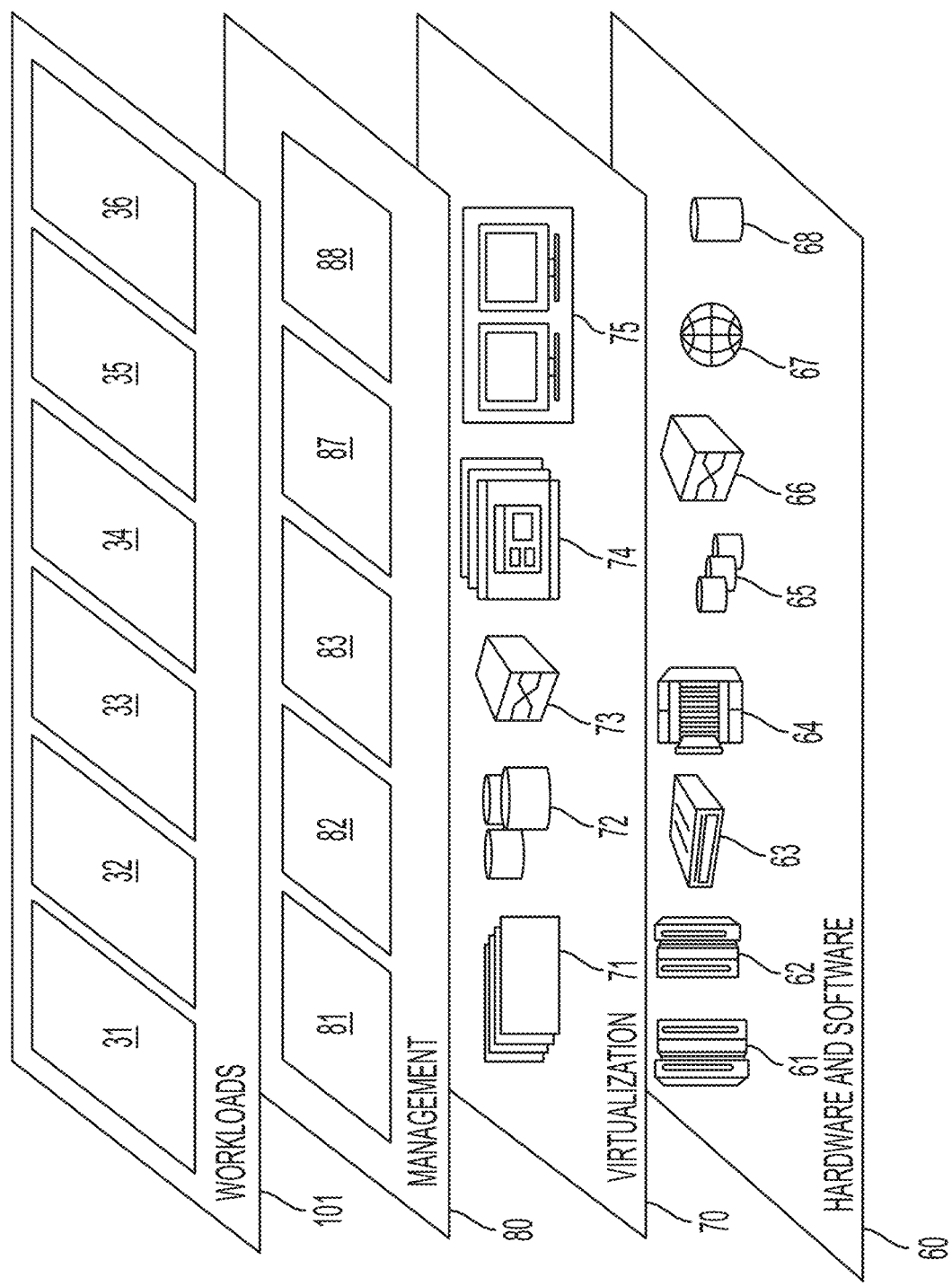
FIG. 16 depicts abstraction model layers, in accordance with embodiments of the present invention.

Referring now to FIG. 16, a set of functional abstraction layers provided by cloud computing environment 50 (FIG. 15) is shown. It should be understood in advance that the components, layers, and functions shown in FIG. 16 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 30 provides examples of functionality for which the cloud computing environment may be utilized. Examples of workloads and functions which may be provided from this layer include: mapping and navigation 31; software development and lifecycle management 32; virtual classroom education delivery 33; data analytics processing 34; transaction processing 35; and use of agents at a data lake to assist training, testing, and deploying a model for predicting one or more outputs from specified input to the model 36.

Examples and embodiments of the present invention described herein have been presented for illustrative purposes and should not be construed to be exhaustive. While embodiments of the present invention have been described herein for purposes of illustration, many modifications and changes will become apparent to those skilled in the art. The description of the present invention herein explains the principles underlying these examples and embodiments, in order to illustrate practical applications and technical improvements of the present invention over known technologies, computer systems, and/or products.

What is claimed is:

1. A method for using agents at a data lake to assist training, testing, and deploying a model for predicting one or more outputs from specified input to the model, said model having originated at a data science platform communicatively coupled to a data lake, said method comprising:
   providing, at the data lake using one or more processors of a computer system at the data lake, a hierarchy of agents with a managing agent at a root node at level 0 of the hierarchy and multiple first level agents at respective nodes at a first level of the hierarchy, each first level agent being a child agent of the managing agent, said first level agents comprising a hardware resources agent, a software resources agent, a data resources agent, a software control agent, and a programming languages agent;
   identifying, by the hardware resources agent using the one or more processors, a plurality of hardware resources stored at the data lake and physical characteristics of each hardware resource, each hardware resource being usable for training and testing the model;
   identifying, by the data resources agent using the one or more processors, model input data stored at the data lake and an access speed for accessing the model input data and portions of the input data distributed in different storage locations in the data lake, said model input data including data usable as the specified input to the model;
   identifying, by the data resources agent using the one or more processors, a first portion of the model input data to be used for said training and testing the model, said identifying the first portion of the model input data being based on a specified target accuracy of the model;
   identifying, by the software resources agent using the one or more processors, a first software resource stored at the data lake, said first software resource being program code configured to split the first portion of the model input data into training input data for training the model and testing input data for testing the model;
   triggering, by the software control agent using the one or more processors, a first execution at the data lake of the first software resource to split the first portion of the model input data into the training input data and the testing input data;
   identifying, by the hardware resources agent using the one or more processors, a first portion of the hardware resources available to be used for training and testing the model, said identifying the first portion of the hardware resources being based on a size of the first portion of model input data, the access speed for accessing the first portion of the model input data, and the physical characteristics of the hardware resources;
   identifying, by the programming languages agent using the one or more processors, a data model training language available at the data lake;
   identifying, by the software resources agent using the one or more processors, a second software resource stored at the data lake, said second software resource being program code configured to be used for optimizing the model in accordance with an optimization algorithm used during said training the model; and
   triggering, by the software control agent using the one or more processors, said training the model at the data lake using the training input data, the first portion of the hardware resources, the data model training language, and the second software resource.

2. The method of claim 1, said method comprising:
   receiving from the data science platform, by the hardware resources agent using the one or more processors, a query to identify hardware resources stored at the data lake and physical characteristics of each hardware resource;
   in response to the received query to identify hardware resources stored at the data lake, said hardware resources agent identifying the plurality of hardware resources stored at the data lake and physical characteristics of each hardware resource; and
   sending to the data science platform, by the hardware resources agent using the one or more processors, an identification of the plurality of hardware resources stored at the data lake and an identification of physical characteristics of each hardware resource.

3. The method of claim 1, said method comprising:
   receiving from the data science platform, by the data resources agent using the one or more processors, a query to identify the model input data stored at the data lake;
   in response to the received query to identify the model input data stored at the data lake, said data resources agent identifying: the model input data stored at the data lake, the access speed for accessing the model input data, and portions of the model input data distributed in different storage locations in the data lake; and
   sending to the data science platform, by the hardware resources agent using the one or more processors, an identification of: the model input data stored at the data lake, the access speed for accessing the model input data, and portions of the model input data distributed in different storage locations in the data lake.

4. The method of claim 1, wherein said identifying, by the hardware resources agent, the plurality of hardware resources comprises:

creating, by the hardware resources agent using the one or more processors, a plurality of hardware resources subagents of the hardware resources agent; and identifying, by a different hardware resources subagent of the plurality of hardware resources subagents using the one or more processors, each hardware resource of the plurality of hardware resources.

5. The method of claim 4, wherein the method comprises:
after said identifying each hardware resource of the plurality of hardware resources, destroying, by the hardware resources agent using the one or more processors, the plurality of hardware resources subagents.

6. The method of claim 1, wherein said identifying, by the by the data resources agent, the first portion of the model input data based on the specified target accuracy of the model comprises:

creating, by the data resources agent using the one or more processors, a historical data subagent of the data resources agent and a data correlation subagent of the data resources agent;

identifying, by the historical data subagent using the one or more processors, historical data stored at data lake for similar models using different sizes of input data;

transmitting, by the historical data subagent using the one or more processors, the historical data to the data correlation subagent;

determining, by the data correlation subagent using the one or more processors, a correlation between accuracy of the similar models and the sizes of input data to the similar models, said historical data being used for said determining the correlation, and utilizing, by the data resources agent using the one or more processors, the correlation to identify the first portion of the model input data based on the specified target accuracy of the model.

7. The method of claim 6, wherein the method comprises:
after said utilizing the correlation, destroying, by data resources agent using the one or more processors, the historical data subagent and the data correlation subagent.

8. The method of claim 7, wherein the method comprises:
after said utilizing the correlation and before said destroying, receiving, by the data resources agent from the managing agent using the one or more processors, an instruction to destroy the historical data subagent and the data correlation subagent.

9. The method of claim 8, wherein the method comprises:
after said utilizing the correlation and before said destroying, receiving, by the managing agent from the data science platform using the one or more processors, the instruction to destroy the historical data subagent and the data correlation subagent.

10. The method of claim 1, wherein the hardware resources comprises multiple data stores at the data lake, wherein physical characteristics of each data store is specific to each data store, wherein the model input data comprises a plurality of sets of model input data stored in respective data stores of the multiple data stores, and wherein said identifying, by the hardware resources agent using the one or more processors, the first portion of the hardware resources comprises:

creating, by the hardware resources agent using the one or more processors, a first hardware resources subagent of the hardware resources agent;

creating, by the first hardware resources subagent using the one or more processors, two hardware resources subagents of the first hardware resources subagent;

selecting via parallel processing, by the two hardware resources subagents functioning cooperatively using the one or more processors consisting of at least two processors, a plurality of data stores of the respective data stores based at least in part on the access speed for accessing each set of the plurality of sets of model input data from the respective data store of the multiple data stores, wherein the plurality of data stores is fewer data stores than a total number of the respective data stores, and wherein the first portion of the hardware resources comprises the plurality of data stores.

11. The method of claim 1, wherein the hierarchy comprises a first programming languages subagent of the programming languages agent and a second programming languages subagent of the programming languages agent, and wherein said identifying, by the programming languages agent, the data model training language comprises:

instructing the first programming languages subagent, by the programming languages agent using the one or more processors, to identify the data model training language;

in response to the first programming languages subagent being unavailable to identify the data model training language, said first programming languages subagent instructing the second programming languages subagent to identify the data model training language; and in response to said instructing the second programming languages subagent, said second programming languages subagent identifying, using the one or more processors, the data model training language.

12. The method of claim 1, wherein training the model comprises:

identifying, by the data resources agent using the one or more processors, a second portion of the model input data to be used as validation input data for validating the trained model during said training the model, said identifying the second portion of the model input data being based on the specified target accuracy of the model;

performing, by the one or more processors, an iterative process, wherein each iteration of the iterative process comprises training the model using the training input data, followed by validating the trained model using the validation input data, wherein the model's accuracy is increased in each successive iteration, and wherein the iterative process uses the first portion of the hardware resources, the data model training language, and the second software resource, wherein the iterative process ends at a final iteration of the iterative process if during the final iteration the validating determines that the specified target accuracy of the model has been achieved.

13. The method of claim 12, said method comprising:
monitoring during the iterative process, by the hardware resources agent using the one or more processors, the first portion of the hardware resources;

ascertaining from said monitoring, by the hardware resources agent using the one or more processors, that a currently unavailable portion of the first portion of the hardware resources is currently unavailable for use during said training the model;

in response to said ascertaining, triggering, by the software control agent using one or more processors, stopping the iterative process;

after said stopping the iterative process, identifying, by the hardware resources agent using the one or more processors, a second portion of the hardware resources available to replace the currently unavailable portion during said training the model, wherein the second portion of the hardware resources is identified based on the unavailable portion of the first portion of the hardware resources, the access speed for accessing the first portion of the model input data, and the physical characteristics of the hardware resources;

replacing, by the hardware resources agent using the one or more processors, the currently unavailable portion by the second portion of the hardware resources; and after said replacing, triggering, by the software control agent using the one or more processors, a resumption of the iterative process.

14. The method of claim 12, wherein after a specified iteration of the iterative process during which said validating determines that the specified target accuracy of the model has not been achieved, said method comprises:

triggering, by the software control agent using one or more processors, stopping the iterative process;

after said stopping the iterative process, identifying, by the data resources agent using the one or more processors, a third portion of the model input data to be used in training and testing the model based on the specified target accuracy of the model, wherein the third portion of the model input data is larger than the first portion of the model input data;

redefining, by the data resources agent using the one or more processors, the first portion of the model input data by replacing the first portion of the model input data with the third portion of the model input data; and after said redefining the first portion of the model input data, triggering, by the software control agent using the one or more processors, a resumption of the iterative process.

15. The method of claim 14, wherein the third portion of the model input data includes a subset of the first portion of the model input data.

16. The method of claim 14, wherein the first and third portions of the model input data are mutually exclusive.

17. The method of claim 12, said method comprising:

after the model has been trained, triggering, by the software control agent using the one or more processors, said testing the model in the data lake using the testing input data and the first portion of the hardware resources.

18. The method of claim 17, said method comprising:

receiving from the data science platform, by the data resources agent using the one or more processors, new input data for deploying the model;

after the model has been tested, triggering, by the software control agent using the one or more processors, deploying the model using the received new input data.

19. A computer program product, comprising one or more computer readable hardware storage devices having computer readable program code stored therein, said program code containing instructions executable by one or more processors of a computer system at a data lake to implement a method for using agents at a data lake to assist training, testing, and deploying a model for predicting one or more outputs from specified input to the model, said model having originated at a data science platform communicatively coupled to the data lake, said method comprising:

providing, at the data lake using the one or more processors, a hierarchy of agents with a managing agent at a root node at level 0 of the hierarchy and multiple first level agents at respective nodes at a first level of the hierarchy, each first level agent being a child agent of the managing agent, said first level agents comprising a hardware resources agent, a software resources agent, a data resources agent, a software control agent, and a programming languages agent;

identifying, by the hardware resources agent using the one or more processors, a plurality of hardware resources stored at the data lake and physical characteristics of each hardware resource, each hardware resource being usable for training and testing the model;

identifying, by the data resources agent using the one or more processors, model input data stored at the data lake and an access speed for accessing the model input data and portions of the input data distributed in different storage locations in the data lake, said model input data including data usable as the specified input to the model;

identifying, by the data resources agent using the one or more processors, a first portion of the model input data to be used for said training and testing the model, said identifying the first portion of the model input data being based on a specified target accuracy of the model;

identifying, by the software resources agent using the one or more processors, a first software resource stored at the data lake, said first software resource being program code configured to split the first portion of the model input data into training input data for training the model and testing input data for testing the model;

triggering, by the software control agent using the one or more processors, a first execution at the data lake of the first software resource to split the first portion of the model input data into the training input data and the testing input data;

identifying, by the hardware resources agent using the one or more processors, a first portion of the hardware resources available to be used for training and testing the model, said identifying the first portion of the hardware resources being based on a size of the first portion of model input data, the access speed for accessing the first portion of the model input data, and the physical characteristics of the hardware resources;

identifying, by the programming languages agent using the one or more processors, a data model training language available at the data lake;

identifying, by the software resources agent using the one or more processors, a second software resource stored at the data lake, said second software resource being program code configured to be used for optimizing the model in accordance with an optimization algorithm used during said training the model; and triggering, by the software control agent using the one or more processors, said training the model at the data lake using the training input data, the first portion of the hardware resources, the data model training language, and the second software resource.

20. A computer system, comprising one or more processors, one or more memories, and one or more computer readable hardware storage devices, said one or more hardware storage devices containing program code executable by the one or more processors via the one or more memories to implement a method for using agents at a data lake to assist training, testing, and deploying a model for predicting one or more outputs from specified input to the model, said model having originated at a data science platform communicatively coupled to the data lake, said method comprising:

providing, at the data lake using the one or more processors, a hierarchy of agents with a managing agent at a root node at level 0 of the hierarchy and multiple first level agents at respective nodes at a first level of the hierarchy, each first level agent being a child agent of the managing agent, said first level agents comprising a hardware resources agent, a software resources agent, a data resources agent, a software control agent, and a programming languages agent;

identifying, by the hardware resources agent using the one or more processors, a plurality of hardware resources stored at the data lake and physical characteristics of each hardware resource, each hardware resource being usable for training and testing the model;

identifying, by the data resources agent using the one or more processors, model input data stored at the data lake and an access speed for accessing the model input data and portions of the input data distributed in different storage locations in the data lake, said model input data including data usable as the specified input to the model;

identifying, by the data resources agent using the one or more processors, a first portion of the model input data to be used for said training and testing the model, said identifying the first portion of the model input data being based on a specified target accuracy of the model;

identifying, by the software resources agent using the one or more processors, a first software resource stored at the data lake, said first software resource being program code configured to split the first portion of the model input data into training input data for training the model and testing input data for testing the model;

triggering, by the software control agent using the one or more processors, a first execution at the data lake of the first software resource to split the first portion of the model input data into the training input data and the testing input data;

identifying, by the hardware resources agent using the one or more processors, a first portion of the hardware resources available to be used for training and testing the model, said identifying the first portion of the hardware resources being based on a size of the first portion of model input data, the access speed for accessing the first portion of the model input data, and the physical characteristics of the hardware resources;

identifying, by the programming languages agent using the one or more processors, a data model training language available at the data lake;

identifying, by the software resources agent using the one or more processors, a second software resource stored at the data lake, said second software resource being program code configured to be used for optimizing the model in accordance with an optimization algorithm used during said training the model; and triggering, by the software control agent using the one or more processors, said training the model at the data lake using the training input data, the first portion of the hardware resources, the data model training language, and the second software resource.

* * * * *